(12) United States Patent
Yang (10) Patent No.: US 7,498,199 B2
(45) Date of Patent: Mar. 3, 2009

(54) METHOD FOR FABRICATING SEMICONDUCTOR PACKAGE

(75) Inventor: Seung Taek Yang, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 44 days.

(21) Appl. No.: 11/777,368

(22) Filed: Jul. 13, 2007

(65) Prior Publication Data
US 2008/0311701 A1    Dec. 18, 2008

(30) Foreign Application Priority Data
Jun. 18, 2007    (KR) .................... 10-2007-0059314

(51) Int. Cl.
*H01L 21/00* (2006.01)
(52) U.S. Cl. .................. 438/108; 438/106; 438/109; 257/E21.001
(58) Field of Classification Search .............. 438/106, 438/108, 109; 257/E21.001
See application file for complete search history.

(56) References Cited

U.S. PATENT DOCUMENTS

| | | | | | |
|---|---|---|---|---|---|
| 4,170,677 | A | * | 10/1979 | Hutcheson | 428/119 |
| 6,110,399 | A | * | 8/2000 | McArdle et al. | 252/513 |
| 6,190,509 | B1 | * | 2/2001 | Haba | 204/164 |
| 6,518,091 | B1 | * | 2/2003 | Haba | 438/107 |
| 6,536,106 | B1 | * | 3/2003 | Jackson et al. | 29/872 |
| 6,733,613 | B2 | * | 5/2004 | Khanna | 156/272.4 |
| 6,908,785 | B2 | * | 6/2005 | Kim | 438/106 |
| 7,122,457 | B2 | * | 10/2006 | Tanida et al. | 438/612 |
| 2006/0270110 | A1 | * | 11/2006 | Steffen | 438/108 |
| 2007/0099345 | A1 | * | 5/2007 | Bauer et al. | 438/107 |
| 2008/0142966 | A1 | * | 6/2008 | Hirano et al. | 257/737 |

FOREIGN PATENT DOCUMENTS

| | | |
|---|---|---|
| KR | 1020010017143 A | 3/2001 |
| KR | 1020010019770 A | 3/2001 |
| KR | 1020020030122 A | 4/2002 |
| KR | 1020070000178 A | 1/2007 |

* cited by examiner

*Primary Examiner*—Alexander G Ghyka
*Assistant Examiner*—Angel Roman
(74) *Attorney, Agent, or Firm*—Ladas & Parry LLP (57) ABSTRACT

A method for fabricating a semiconductor package includes the steps of: forming a material layer containing conductive particles on a semiconductor chip having a plurality of bonding pads on the upper surface thereof, baking the material layers to a non-flowing state; attaching the semiconductor chip in a face down manner to a substrate having connecting pads on the location corresponding to the bonding pads by using the material layers containing conductive particles; applying voltage for a electrical signal exchange to the semiconductor chip and the substrate so that the conductive particles are gathered between the bonding pads of the semiconductor chip and the connecting pads of the substrate; and curing the conductive particles of the material layers so that the conductive particles gathered between the bonding pads of the semiconductor chip and the connecting pads of the substrate to an non-flowing state.

20 Claims, 8 Drawing Sheets

METHOD FOR FABRICATING SEMICONDUCTOR PACKAGE

CROSS-REFERENCE TO RELATED APPLICATIONS

The present application claims priority to Korean patent application number 10-2007-0059314 filed on Jun. 18, 2007, which is incorporated herein by reference in its entirety.

BACKGROUND OF THE INVENTION

The present invention relates to a method for fabricating a semiconductor package, and more particularly to a method for fabricating a semiconductor package capable of implementing fine pitch.

The semiconductor package uses a soldering manner through the use of a lead frame as a method to mount a semiconductor chip on an external circuit. However, although the soldering manner through the use of the lead frame has advantages of easiness in process progress and excellence in reliability, it also has a disadvantage related to electrical characteristics because of the length of the transfer of the electrical signal between the semiconductor chip and the external circuit.

In order to solve such a problem, it has been proposed to package a flip chip package at a high density. The flip chip package is created by disposing electrically connectable material, such as a bump, between bonding pads of the semiconductor chip and connecting pads of the substrate.

Figure 1:
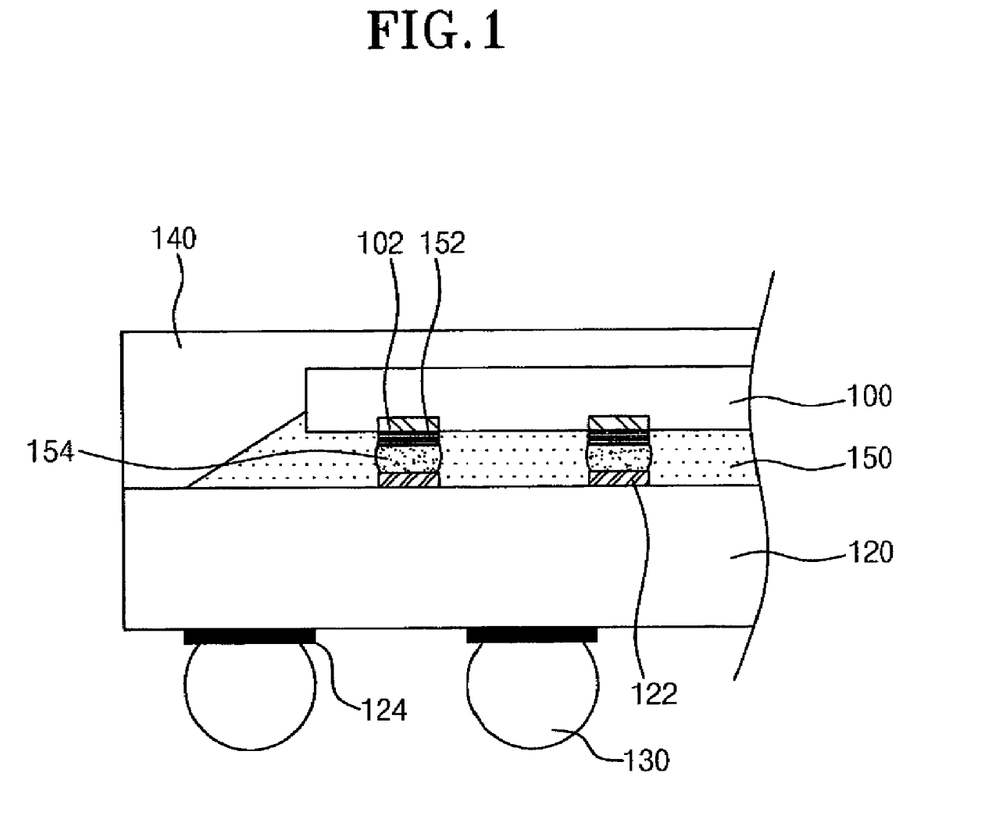
FIG. 1 is a cross-sectional view showing a flip chip package having a conventional bump.

FIG. 1 is a cross-sectional view showing a flip chip package having a conventional bump.

For example, the prior art introduces a flip chip package that is formed by attaching a semiconductor chip 100 provided with a plurality of bonding pads 102 on a substrate 120 provided with connecting pads 122 by using a solder bump 154. The solder bump 154 is disposed between the bonding pads 102 and the connecting pads 122 to electrically and physically connect the semiconductor chip to the substrate 120.

In FIG. 1, the reference numerals 124 represents a ball land, 130 represents a solder ball, 140 represents an encapsulant, and 150 represents a filler.

Since the flip chip package has a short electrical signal path, the resistance is reduced so that it has excellent electrical characteristics in that the power required can be reduced and the operation speed of the semiconductor package can be improved. Since the rear surface of the semiconductor chip is exposed to the external circuit, the thermal characteristics of the semiconductor chip are excellent. This makes it possible to implement the semiconductor package with reduced thickness.

However, the conventional flip chip package should form a filler in order to protect the electrical connecting portion between the semiconductor chip and the substrate by a solder bump, and that process becomes complicated. Since the solder bump generally used in the flip ship package is formed in a circle, it is difficult to implement fine pitch, and if the solder bump shape is formed below a predetermined size in order to form the fine pitch, the reliability of a joint unit deteriorates.

SUMMARY OF THE INVENTION

Embodiments of the present invention are directed to a method for fabricating a semiconductor package capable of implementing fine pitch.

In one embodiment, a method for fabricating a semiconductor package may comprise: forming a material layer containing conductive particles on a semiconductor chip having a plurality of bonding pads on the upper surface thereof; baking the material layer to non-flowing state; attaching the semiconductor chip in a face down manner to a substrate provided with connecting pads on the location thereof corresponding to the bonding pads by using the material layer containing conductive particles; applying voltage for electrical signal exchange to the semiconductor chip and the substrate so that the conductive particles are gathered between the bonding pads of the semiconductor chip and the connecting pads of the substrate; and curing the material layer containing the conductive particles so that the conductive particles gathered between the bonding pads of the semiconductor chip and the connecting pads of the substrate to a non-flowing state.

The material layer is formed of a polymer.

The material layer containing the conductive particles is formed at 5 to 50 μm thickness.

The conductive particles are 100 to 10000 nm in diameter.

The conductive particles are formed of any one of tin (Sn), nickel (Ni), copper (Cu), silver (Au), and aluminum (Al) or an alloy respectively thereof.

The conductive particles are formed by coating the surface of the polymer particle with any one of tin (Sn), nickel (Ni), copper (Cu), silver (Au), and aluminum (Al) or an alloy respectively thereof.

The baking of the material layer is performed at the temperature of 80 to 120° C.

The curing of the conductive particles of the material layer is performed at the temperature of 120 to 150° C.

After curing the conductive particles of the material layer, the method further comprises forming an encapsulant on the upper surface of the substrate in order to cover the semiconductor chip, and attaching a solder ball to the lower surface of the substrate.

In another embodiment, a method for fabricating a semiconductor package may comprise: stacking, face-down, at least two semiconductor chips having a via pattern connected to bonding pads on the location corresponding to connecting pads on a substrate and the substrate also having a material layer containing conductive particles on the upper surface thereof; applying voltage for electrical signal exchange to the stacked semiconductor chips and the substrate so that the conductive particles are gathered between the via pattern comprising the bonding pads of the stacked semiconductor chips and the connecting pads of the substrate; and curing the material layer containing the conductive particles so the conductive particles gathered between the via patterns of the stacked semiconductor chips, and between the bottom semiconductor chips and the connecting pads of the substrate are in a non-flowing state.

The material layer is formed of a polymer.

The material layer containing the conductive particles is formed at 5 to 50 μm thickness.

The conductive particles are 100 to 10000 nm in diameter.

The conductive particles are formed of any one of tin (Sn), nickel (Ni), copper (Cu), silver (Au), and aluminum (Al) or an alloy respectively thereof.

The conductive particles are formed by coating the surface of the polymer particle with any one of tin (Sn), nickel (Ni), copper (Cu), silver (Au), and aluminum (Al) or an alloy respectively thereof.

The curing of the conductive particles of the material layer is performed at the temperature of 120 to 150° C.

The stacking of the semiconductor chips is performed at a wafer level.

After stacking the semiconductor chips at a wafer level, the method further comprises sawing the stacked semiconductor chips at a chip level.

After curing the material layer, the method further comprises forming a capping layer formed on the upper of the stacked top semiconductor chip.

After curing the material layer, the method further comprises forming an encapsulant on the upper surface of the substrate in order to cover the semiconductor chip; and attaching a solder ball to the lower surface of the substrate.

DESCRIPTION OF SPECIFIC EMBODIMENTS

In forming semiconductor packages in a single piece or a stacked shape, the present invention interposes material layers containing conductive particles between semiconductor chips, and between a semiconductor chip and a substrate. The present invention also applies voltage between the semiconductor chip and the substrate to allow the conductive particles to be disposed only between the bonding pads of the semiconductor chip and the connecting pads of the substrate, thereby forming an electrical connection between the semiconductor chip and the substrate.

Therefore, the present invention can form an electrical connection between the semiconductor chip and the substrate with the size of the surface area of the bonding pads of the semiconductor chip and the connecting pads of the substrate so that fine pitch can be implemented. As such, the present invention can reduce the interval between the semiconductor chip and the substrate so that a semiconductor package having a thinner thickness can be implemented.

Also, since the electrical connection is formed by using a voltage application, the present invention can form the electrical connection in a self alignment. Furthermore, the material layer is cured to serve as a filler in the flip chip package, making it possible to improve the reliability of a joint unit.

Hereinafter, preferred embodiments of the present invention will be described in detail with reference to the accompanying drawings.

FIGS. 2A to 2D are cross-sectional views every process for explaining a method for fabricating a semiconductor package according to a first embodiment of the present invention.

Figure 2A:
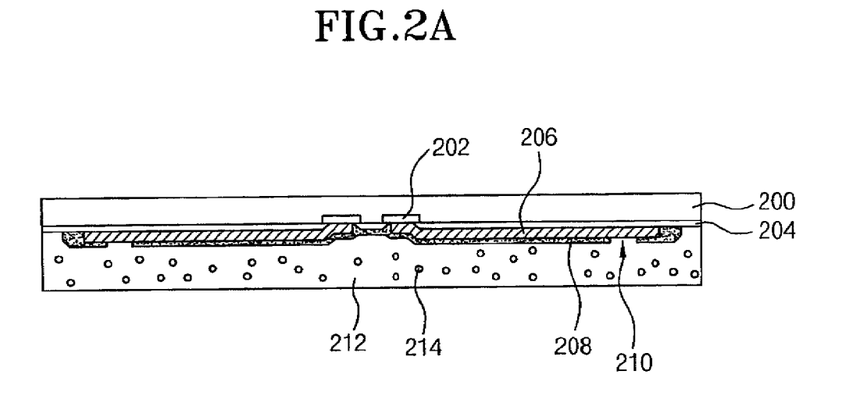
FIGS. 2A to 2D are cross-sectional views explaining a method for fabricating a semiconductor package according to a first embodiment of the present invention.

Referring to FIG. 2A, second bonding pads 210 are rewired by a rewiring process using a metal wiring 206 and an insulating layer 208 on a semiconductor chip 200 also having first bonding pads 202 on the upper surface. A material layer 210 containing conductive particles 214 is formed on the semiconductor chip 200 having the rewired second bonding pads 210.

The material layer 212 containing the conductive particles 214 is formed at thickness of 5 to 50 μm in a spin-coating manner using a polymer. The conductive particles 214 are 100 to 10000 nm in diameter and are formed of any one of tin (Sn), nickel (Ni), copper (Cu), silver (Au), and aluminum (Al) or an alloy respectively thereof. Also, the conductive particles 214 are 100 to 10000 nm in diameter and are formed by coating any one of tin (Sn), nickel (Ni), copper (Cu), silver (Au), and aluminum (Al) or an alloy respectively thereof on the surface of the polymer particles.

The material layer 212 containing the conductive particles 214 should be baked at the temperature of 80 to 120° C. The bake is performed to prevent the material layer 212 from having a flowing property. The back removes the volatile contained in the material layer 212. The bake is preferably performed in the range of the temperature and the time necessary that the conductive particles 214 contained in the inside of the material layer 212 can be remaining in a flowing state. The protective layer 204 covers the upper layer of the semiconductor chip 200.

Figure 2B:
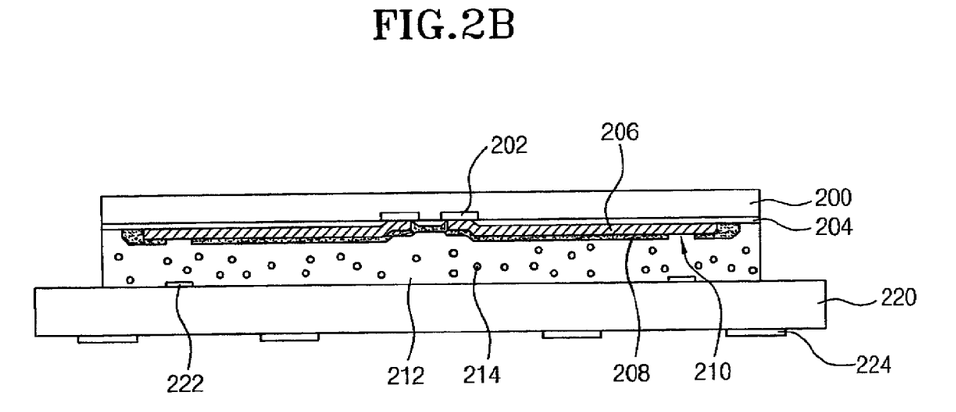

Referring to FIG. 2B, connecting pads 222 are at a location on the substrate 220 corresponding to the rewired second bonding pad 210 of the semiconductor chip 200. A substrate 220 having a ball land 224 is on the upper surface of the semiconductor chip 200 so that the semiconductor chip 200 is attached in a face down manner on the substrate 220 by using the material layer 212 containing conductive particles 214.

Figure 2C:
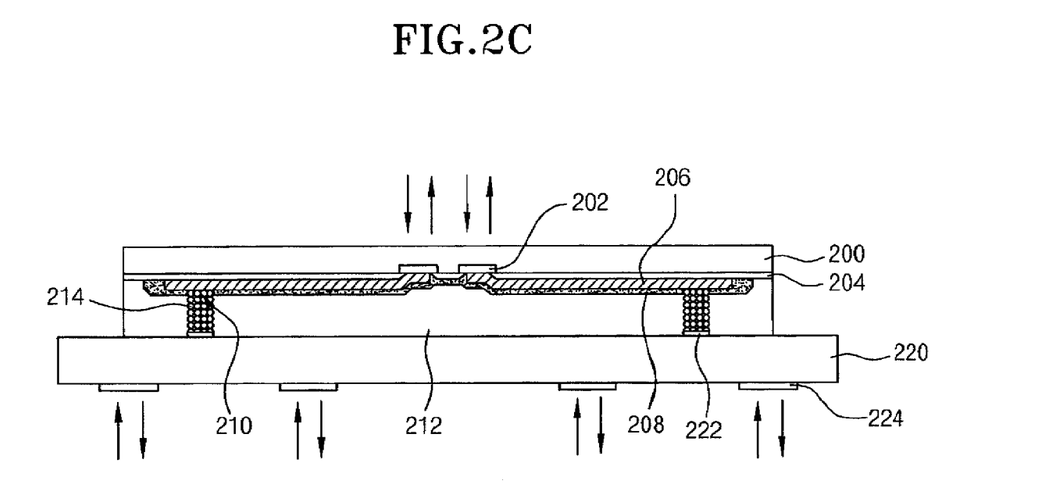

Referring to FIG. 2C, the voltage for transfer of the electrical signal between the semiconductor chip 200 and the substrate 220 is applied to the bonding pads 202 of the semiconductor chip 200 and the ball land 224 of the substrate 220 to allow the conductive particles 214 contained within the material layer 212 to be gathered between the rewired bonding pads 210 of the semiconductor chip 200 and the connecting pads 222 of the substrate 220. Thereafter, the material layer 212 containing the conductive particles 214 are cured in order to prevent the flow of the conductive particles 214 gathered between the rewired second bonding pads 210 of the semiconductor chip 200 and the connecting pads 222 of the substrate 220. The curing process is preferably performed at the temperature of 120 to 250° C.

Figure 2D:
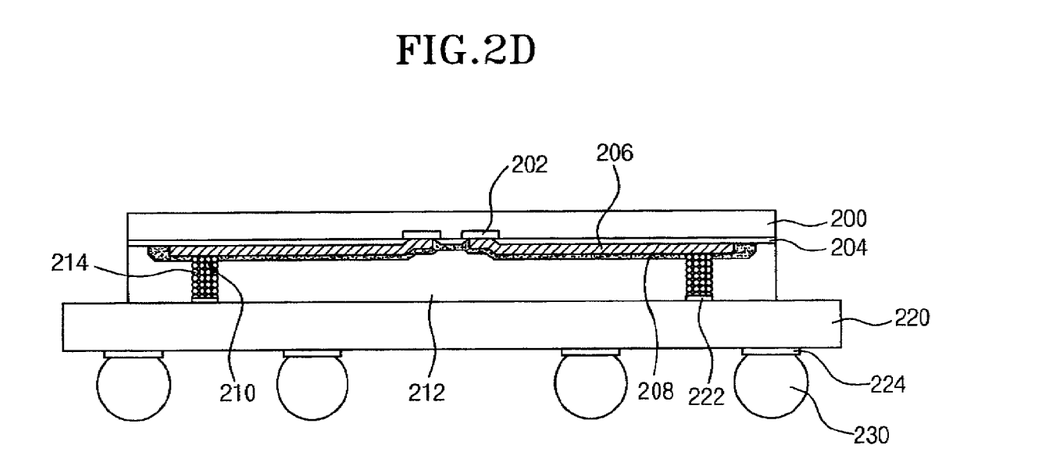

Referring to FIG. 2D, the fabrication of the semiconductor package according to the present invention is completed by attaching an external connecting terminal 230, for example, a solder ball 230, to the ball land 224 on the lower surface of the substrate 220.

Figure 3:
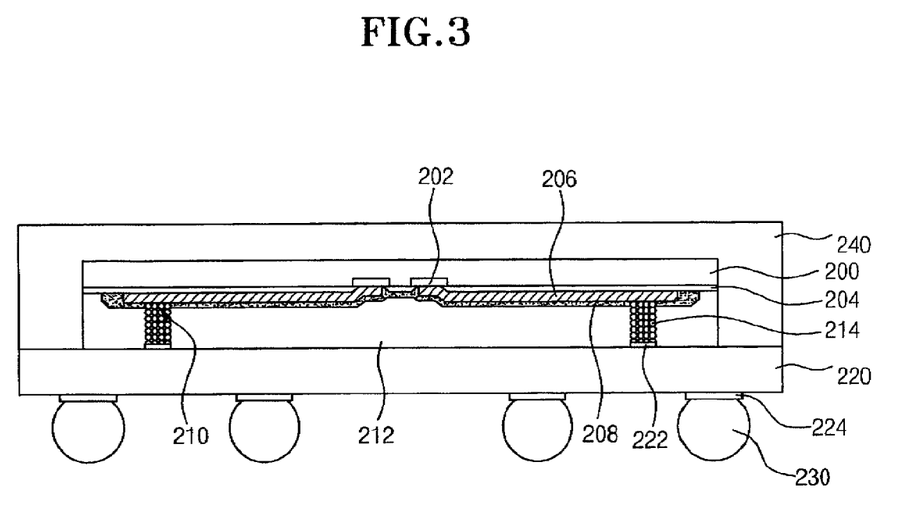
FIG. 3 is a cross-sectional view explaining a method for fabricating a semiconductor package according to a second embodiment of the present invention.

According to a second embodiment, as shown in FIG. 3, a semiconductor package can be fabricated by forming an encapsulant 240 on the substrate 220 so that it covers the semiconductor chip 200 in order to protect the semiconductor chip 200 and the material layer 212. Then, an external connecting terminal 230, for example, a solder ball 230, can be attached to a ball land 224 on the lower surface of the substrate 220.

As described above, the present invention electrically connects the bonding pads 210 of the semiconductor chip 200 and the connecting pads 222 of the substrate 220 by using the material layer 212 containing the conductive particles 214 interposed between the semiconductor chip 200 and the substrate 220 so that fine pitch can be implemented. Therefore, the present invention can reduce the interval between the semiconductor chip 200 and the substrate 220 so that a semiconductor package having a thinner thickness can be implemented.

Meanwhile, a stacked semiconductor package can be fabricated by inter-connecting semiconductor chips 200 using the material layer 212 containing the conductive particles 214.

FIGS. 4A to 4D are cross-sectional views every process for explaining a method for fabricating a semiconductor package according to a third embodiment of the present invention.

Figure 4A:
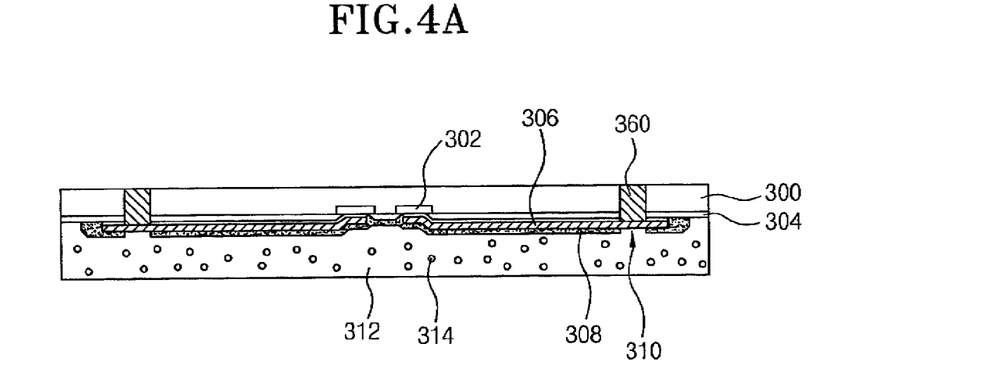
FIGS. 4A to 4D are cross-sectional views explaining a method for fabricating a semiconductor package according to a third embodiment of the present invention.

Referring to FIG. 4A, second bonding pads 310 are rewired by a rewiring process using metal wiring 306 and an insulating layer 308 on a semiconductor chip 300 having a first bonding pad 302 are formed on the upper surface. The rewired second bonding pads 310 are exposed by etching the portion of the semiconductor chip 300 below the rewired second bonding pads 310, and then a via pattern 360 is formed by filling the etching of the semiconductor chip with metal material so that it contacts the rewired second bonding pads 310. The via pattern 360 is formed of any one of tin (Sn), nickel (Ni), copper (Cu), silver (Au), and aluminum (Al) or an alloy respectively thereof.

After forming the material layer 312, containing the conductive particles 314, on the semiconductor chip 300 having the rewired bonding pads 310, the material layer 312 is baked in the range of the temperature and the time to prevent the flow of the material layer 312 containing the conductive particles 314, but the conductive particles 314 contained in the inside thereof are still able to flow. The protective layer 204 covers the upper layer of the semiconductor chip 200.

Figure 4B:
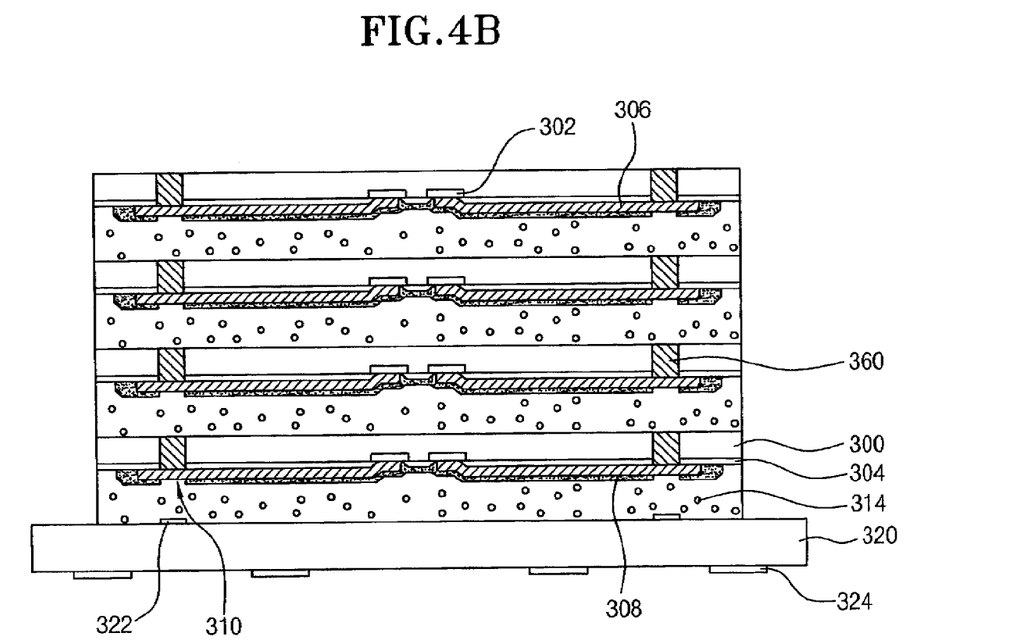

Referring to FIG. 4B, at least two semiconductor chips 300 obtained from the process of FIG. 4A, as described above, are stacked face-down using, as a medium, the material layers 312 which contain the conductive particles 314 to the substrate 320 having the connecting pad 322 at the position corresponding to the rewired second bonding pad 310.

Figure 4C:
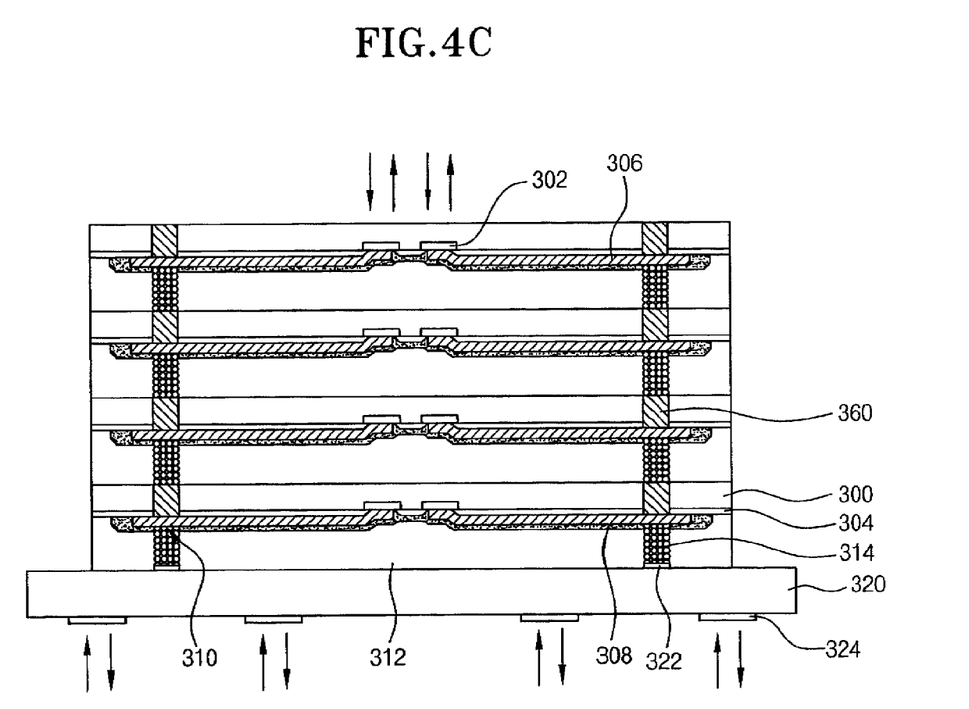

Referring to FIG. 4C, the conductive particles 314 in the material layers 312 are collected between the rewired second bonding pad 310 of the semiconductor chips 300 and the via patterns 360 and between the rewired second bonding pad 310 of the bottom semiconductor chip 300, and further to the connecting pad 322 of the substrate 320, by applying the voltage for the electrical signal transfer between the stacked semiconductor chips 300 and the substrate 320.

By performing a curing process to the material layers 312, the conductive particles 314 collected between the via patterns 360, including the rewired second bonding pad 310 of the stacked semiconductor chips 300, the second bonding pad 310 of the stacked bottom semiconductor chip and the connecting pad 322 of the substrate 320, can be in a non-flowing state so that the stable connection is made between the semiconductor chips 300 and the substrate 320.

Figure 4D:
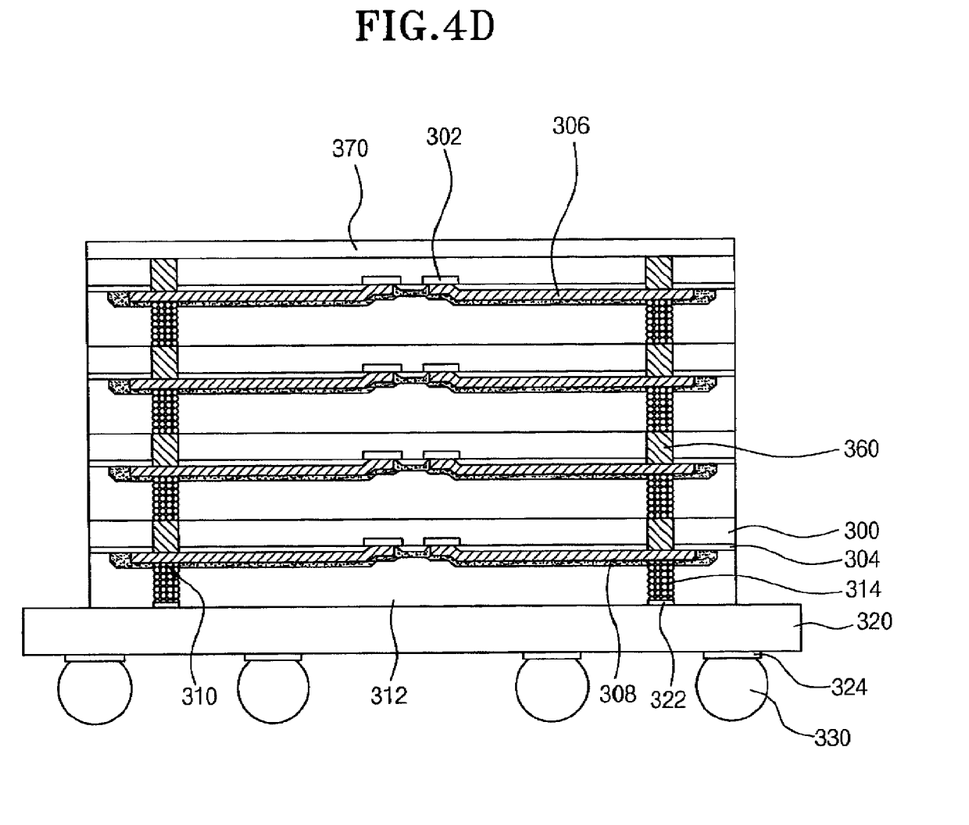

Referring to FIG. 4D, in order to electrically insulate and protect the stacked top semiconductor chip 300, a capping film 370 is formed on the stacked top semiconductor chip 300. The ball land 324 on the lower surface of the substrate 320 is attached with an external connecting terminal 330, for example, a solder ball 330 to complete the stack semiconductor package.

Figure 5:
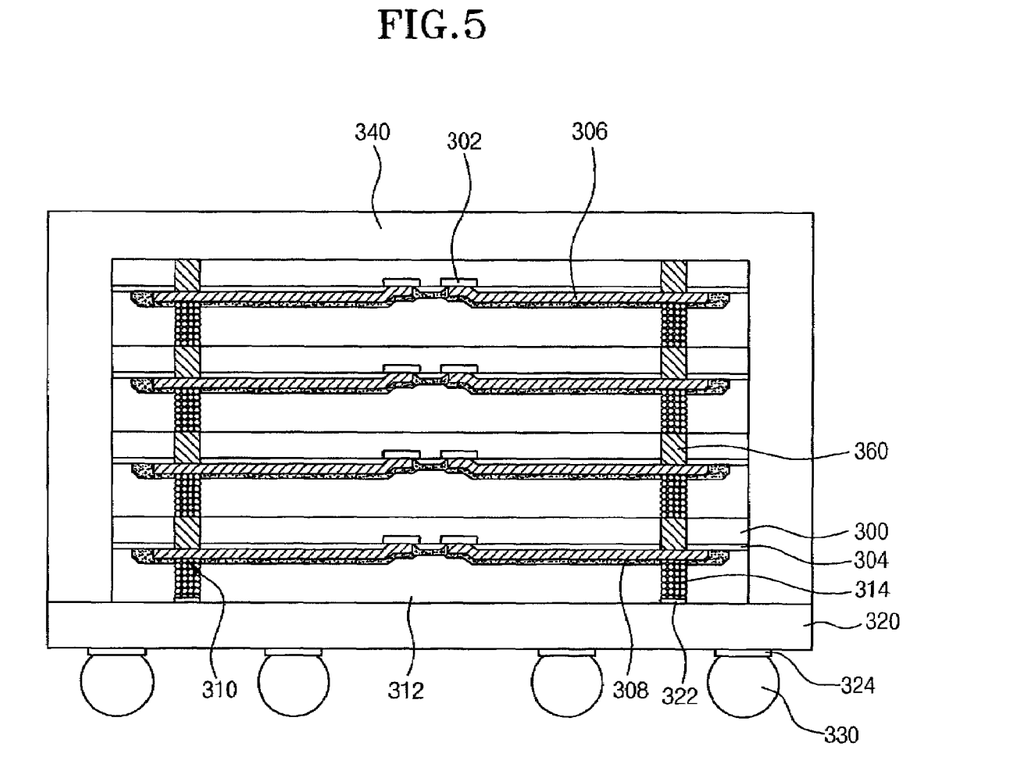
FIG. 5 is a cross-sectional view explaining a method for fabricating a semiconductor package according to a fourth embodiment of the present invention.

Meanwhile, in the fourth embodiment, as shown in FIG. 5, in order to protect and insulate the semiconductor chip 300 and the material layer 312, the stack semiconductor package can be fabricated by forming the encapsulant 340 on the substrate 320 to surround the semiconductor chip 300.

Also, although not shown, the semiconductor chip on which the via patterns are not formed is disposed on the top of the stacked semiconductor chips, making it possible to fabricate the stack semiconductor package.

Meanwhile, the method for fabricating the semiconductor package shown in FIGS. 4A to 4D is progressed by the wafer level or the chip level, preferably, the wafer level. When the formation of the semiconductor package is progressed by the wafer level, the chip level is separated by progressing a sewing process after stacking the semiconductor chips. Then, subsequent processes are progressed.

Also, the method for fabricating the semiconductor package can be progressed by using a film containing the conductive particles therein, instead of the polymer containing the conductive particles.

As described above, with the present invention, in fabricating semiconductor packages in a single piece or a stacked shape, the present invention uses as a medium, conductive particles contained in a material layer interposed between a semiconductor chips and a substrate, or between the semiconductor chips to electrically connect between the bonding pads of the semiconductor chip and the connecting pads of the substrate so that a fine pitch can be implemented, and the present invention can reduce the interval between the semiconductor chip and the substrate so that a semiconductor package having a thinner thickness can be implemented.

Also, since the electrical connection is formed by using voltage application, the present invention can form the electrical connection in a self alignment. Furthermore, the material layer is cured to serve as a filler in the flip chip package, making it possible to improve the reliability of a joint unit.

Although a specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for fabricating a semiconductor package comprising the steps of:
    forming a material layer containing conductive particles on a semiconductor chip having a plurality of bonding pads on the upper surface thereof;
    baking the material layers to a non-flowing state;
    attaching the semiconductor chip in a face down manner to a substrate having connecting pads at a location corresponding to the bonding pads of the semiconductor chip by using the material layers containing conductive particles;
    applying voltage for electrical signal exchange to the semiconductor chip and the substrate so that the conductive particles are gathered between the bonding pads of the semiconductor chip and the connecting pads of the substrate; and
    curing the material layers containing the conductive particles so that the conductive particles gathered between the bonding pads of the semiconductor chip and the connecting pads of the substrate are in a non-flowing state.

2. The method as set forth in claim 1, wherein the material layer is formed of a polymer.

3. The method as set forth in claim 1, wherein the material layer containing the conductive particles is formed at 5 to 50 μm thickness.

4. The method as set forth in claim 1, wherein the conductive particles are 100 to 10000 nm in diameter.

5. The method as set forth in claim 1, wherein the conductive particles are formed of any one of tin (Sn), nickel (Ni), copper (Cu), silver (Au), and aluminum (Al) or an alloy respectively thereof.

6. The method as set forth in claim 1, wherein the conductive particles are formed by coating the surface of the polymer particle with any one of tin (Sn), nickel (Ni), copper (Cu), silver (Au), and aluminum (Al) or an alloy respectively thereof.

7. The method as set forth in claim 1, wherein baking of the material layer is performed at the temperature of 80 to 120° C.

8. The method as set forth in claim 1, wherein the curing of the conductive particles of the material layers is performed at the temperature of 120 to 150° C.

9. The method as set forth in claim 1, wherein after curing the conductive materials of the material layers, the method further comprises forming an encapsulant on the upper surface of the substrate in order to cover the semiconductor chip; and attaching a external connecting terminal to the lower surface of the substrate.

10. A method for fabricating a semiconductor package comprising the steps of:
    stacking, face-down, at least two semiconductor chips having via patterns connected to bonding pads on a location corresponding to connecting pads on a substrate and also having a material layer containing conductive particles on the upper surface thereof;
    applying voltage for electrical signal exchange to the stacked semiconductor chips and the substrate so that the conductive particles are gathered between the via patterns comprising the bonding pads of the stacked semiconductor chips and the connecting pads of the substrate; and
    curing the material layers containing the conductive particles so the conductive particles gathered between the via patterns of the stacked semiconductor chips, and between the bottom semiconductor chips and the connecting pads of the substrate are in a non-flowing state.

11. The method as set forth in claim 10, wherein the material layer is formed of a polymer.

12. The method as set forth in claim 10, wherein the material layer containing the conductive particles is formed at 5 to 50 μm thickness.

13. The method as set forth in claim 10, wherein the conductive particles are 100 to 10000 nm in diameter.

14. The method as set forth in claim 10, wherein the conductive particles are formed of any one of tin (Sn), nickel (Ni), copper (Cu), silver (Au), and aluminum (Al) or an alloy respectively thereof.

15. The method as set forth in claim 10, wherein the conductive particles are formed by coating the surface of the polymer particle with any one of tin (Sn), nickel (Ni), copper (Cu), silver (Au), and aluminum (Al) or an alloy respectively thereof.

16. The method as set forth in claim 10, wherein the curing of the conductive particles of the material layer is performed at the temperature of 120 to 150° C.

17. The method as set forth in claim 10, wherein the stacking of the semiconductor chips is performed at a wafer level.

18. The method as set forth in claim 17, wherein after stacking the semiconductor chips at a wafer level, the method further comprises sawing the stacked semiconductor chips at a chip level.

19. The method as set forth in claim 10, wherein after curing the conductive particles of the material layers, the method further comprises forming a capping layer formed on the upper of the stacked top semiconductor chip.

20. The method as set forth in claim 10, further comprising after curing the material layers,
    forming an encapsulant on the upper surface of the substrate in order to cover the semiconductor chip; and
    attaching an external connecting material to the lower surface of the substrate.

* * * * *